(12) United States Patent
Litwin et al.

(10) Patent No.: US 6,291,859 B1
(45) Date of Patent: Sep. 18, 2001

(54) INTEGRATED CIRCUITS

(75) Inventors: Andrej Litwin, Danderyd; Hans Norstrom, Solna, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/377,829

(22) Filed: Aug. 20, 1999

(30) Foreign Application Priority Data

Aug. 28, 1998 (GB) .................................................. 9818895

(51) Int. Cl.⁷ ........................... H01L 29/76; H01L 27/01; H01L 21/8238; H01L 21/336
(52) U.S. Cl. ........................... 257/368; 257/348; 438/222; 438/223; 438/298
(58) Field of Search .................................... 257/341, 348, 257/368, 369; 438/298, 217, 222, 223

(56) References Cited

U.S. PATENT DOCUMENTS

| 4,595,941 | * | 6/1986 | Avery | 357/43 |
| 4,698,653 | * | 10/1987 | Cardwell, Jr. | 357/22 |
| 5,319,236 | * | 6/1994 | Fujihira | 257/493 |
| 5,323,043 | | 6/1994 | Kimura et al. | |
| 5,726,475 | * | 3/1998 | Sawada | 257/369 |

FOREIGN PATENT DOCUMENTS

| 0 422 250 | 4/1991 | (EP) . |
| 0 817 268 | 1/1998 | (EP) . |

OTHER PUBLICATIONS

Patent Abstracts of Japan vol. 012, No. 330 (E–655), Sep. 1988—& JP 63 094667A (Fuji Electric Co. Ltd.), Apr. 1988, Abstract; Fig. 5.

* cited by examiner

*Primary Examiner*—Matthew S Smith
*Assistant Examiner*—Lex H. Malsawma

(57) ABSTRACT

A semiconductor integrated circuit comprises a substrate (1) of a first conduction type semiconductor material, an epitaxial layer (10) which is carried by the substrate (1) and which is of a second conduction type semiconductor material different to the first conduction type material, a well (3) of semiconductor material in the epitaxial layer and a semiconductor material, the epitaxial layer (10) being substantially depleted of charges is a region substantially beneath the well (3).

11 Claims, 3 Drawing Sheets

INTEGRATED CIRCUITS

The present invention relates to integrated circuits, and in particular, but not exclusively, to noise sensitive, mixed signal circuits.

DESCRIPTION OF THE RELATED ART

A recent trend in the design of digital radio for mobile telephony is to combine as many functions as possible on a single monolithic integrated circuit IC. For example, digital circuitry, and analogue-to-digital (A/D) and digital-to-analogue (D/A) converters are usually implemented in CMOS technology. The analogue radio frequency (RF) circuitry can also be implemented in CMOS technology, which can lead to integration of such circuits. For example, see S. Sheng et al. "A Low-Power CMOS Chipset for Spread-Spectrum Communications", International Solid-State Circuits Conference, 1996.

The demand for higher levels of integration leads to the implementation of high-resolution analogue circuits on the same substrate as large digital VLSI systems. However, in such mixed-signal systems, the coupling of digital switching noise into sensitive analogue circuits can significantly limit the performance that can be achieved in analogue signal processing and data conversion circuits. The noise coupling generally occurs through the silicon substrate of the integrated circuit. For example, see R. B. Merrill, W. M. Young, K. Brehmer "Effect of Substrate Material on Crosstalk in Mixed Analog/Digital Integrated Circuits" IEDM Tech. Dig. 1994, pp. 433–436.

A typical CMOS integrated circuit design is shown in FIGS. 1 and 2. FIG. 1 shows a PMOS transistor, and FIG. 2 shows an NMOS transistor. The integrated circuit are formed on a substrate 1 of p+ type semiconductor material. The substrate 1 carries an epitaxial layer 2 of p type semiconductor material, in which there is formed a well 3, 3' of material. In the case of a PMOS transistor (FIG. 1), the well 3 is of n type material, and in the case of an NMOS transistor (FIG. 2), the well is of p type material. As is well known, the transistor structure is formed by providing source and drain areas 4, 4', 5, 5' within the well 3, 3' and a gate region 6 above the well 3, 3'. The PMOS transistor has source and drain areas 4, 5 of p+ type material, and the NMOS transistor has source and drain areas 4', 5' of n+ type material.

An implant region 7 is provided which serves to control the threshold voltage (Vth) of the transistor. The threshold voltage is set by the charge content of the implant region 7.

With the design of CMOS integrated circuit shown in FIGS. 1 and 2, digital switching noise from digital circuits located on the same substrate as analogue circuits can easily disturb those analogue circuits.

The addition of pn-junctions to isolate the NMOS transistors from the substrate can improve the noise rejection characteristics of combined circuits. For example an extra deep n-type well can be used to surround the p-type well of an NMOS transistor. For example, U.S. Pat. No. 5,323,043 improves the noise isolation by introducing junction capacitances between the transistors and the substrate.

However, such solutions require the use of an additional diffused layer or well of material, which can increase the cost of the integrated circuit.

SUMMARY OF THE PRESENT INVENTION

According to a first aspect of the present invention there is provided a semiconductor integrated circuit comprising a substrate of a first conduction type semiconductor material, an epitaxial layer which is carried by the substrate and which is of a second conduction type semiconductor material different to the first conduction type material, a well of semiconductor material in the epitaxial layer and a semiconductor device formed in and/or on said well of semiconductor material, wherein the epitaxial layer is substantially depleted of charges in a region substantially beneath the well when the circuit is subjected to a bias voltage.

According to a second aspect of the present invention, there is provided a method of manufacturing a semiconductor integrated circuit comprising:

providing a substrate of first conduction type semiconductor material;

forming an epitaxial layer of semiconductor material on the substrate;

forming a well of semiconductor material in the epitaxial layer; and forming a semiconductor device structure in and/or on the well of the material, wherein the epitaxial layer is of a second conduction type semiconductor material, the second conduction type being different to the first conduction type, and wherein the epitaxial layer is formed so as to be substantially depleted of charges in a region substantially beneath the well when the circuit is subjected to a bias voltage.

DETAILED DESCRIPTION OF THE PREFERRED EMBODIMENTS

Figure 1:
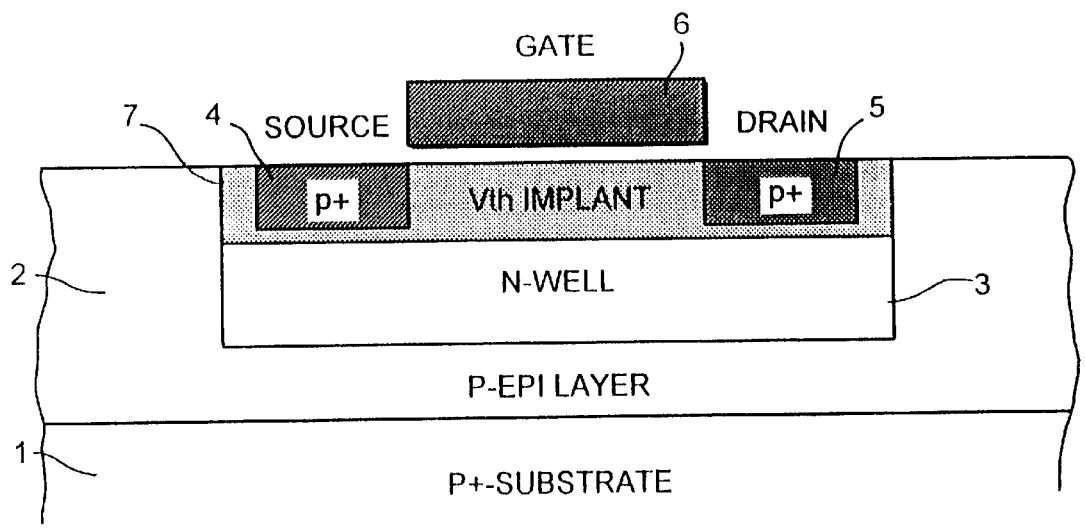
FIGS. 1 and 2 show conventional PMOS and NMOS enhancement transistor structures respectively.
Figure 2:
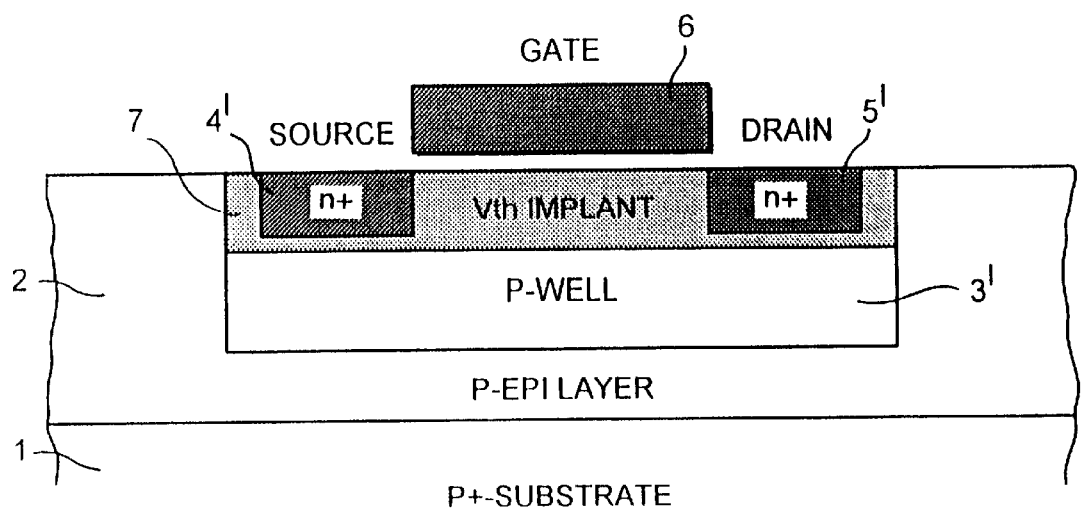
Figure 3:
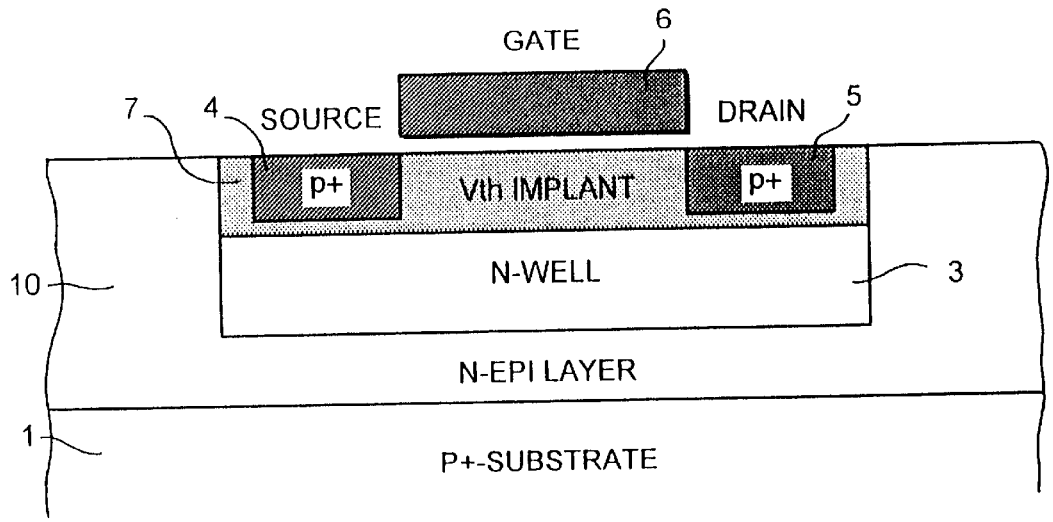
FIGS. 3 and 4 respectively show PMOS and NMOS enhancement transistors embodying the present invention.
Figure 4:
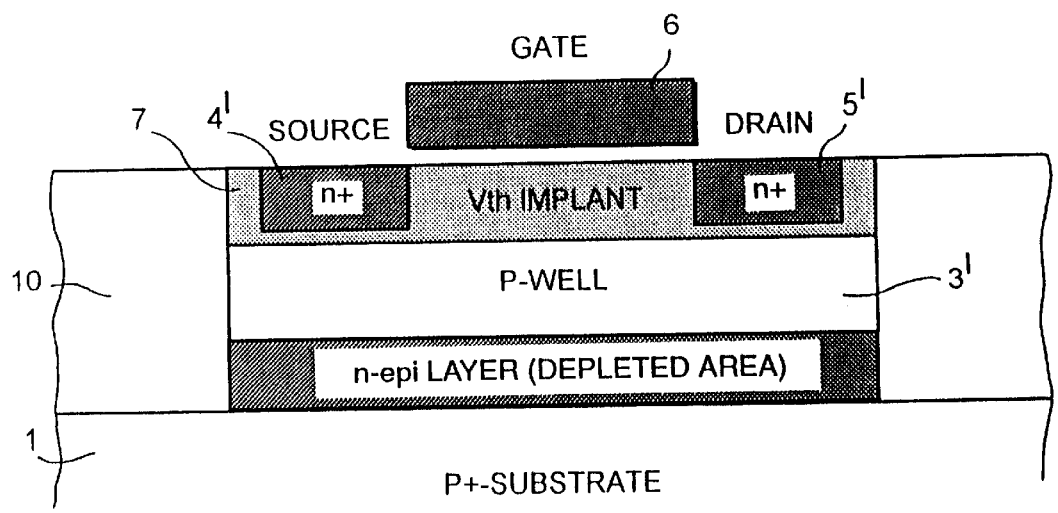

FIGS. 3 and 4 respectively show PMOS and NMOS transistors embodying the present invention. It should be noted that the transistor structures are described by way of example only, and that the present invention is applicable to any integrated circuit having devices formed in well in a semiconductor layer carried by a substrate.

An integrated circuit having a structure embodying the present invention has a substrate 1 which carries an epitaxial layer 10. The epitaxial layer 10 is of a different conduction type semiconductor material to the substrate. In the examples shown in FIGS. 3 and 4, the substrate is p+ type material, and the epitaxial layer is n-type material.

Devices are formed in wells of material, as before, a PMOS transistor being formed in an n-type well and an NMOS transistor being formed in a p-type well. The structure of the transistors themselves is conventional as previously described.

In an integrated circuit embodying the invention and having a p+ type substrate, a device formed in an n-type well (eg. PMOS transistor) in the n-type epitaxial layer has an isolating p-n junction formed between the substrate and the n-type epitaxial layer. The p-n junction serves to isolate the transistor from signals carried by the substrate.

A device formed in a p-type well (eg. an NMOS transistor) has two isolating pn-junctions formed between the device and the substrate. This results in increased isolation between the device and the substrate. This is in contrast to the conventional devices in which there are no isolating junctions present.

To achieve signal isolation between the transistor and the substrate and to avoid latch up problems, the epitaxial layer should be optimised in such way that the region beneath the well (as shown in FIG. 4) is fully depleted of electrical charges, when the circuit is under voltage bias.

Figure 5:
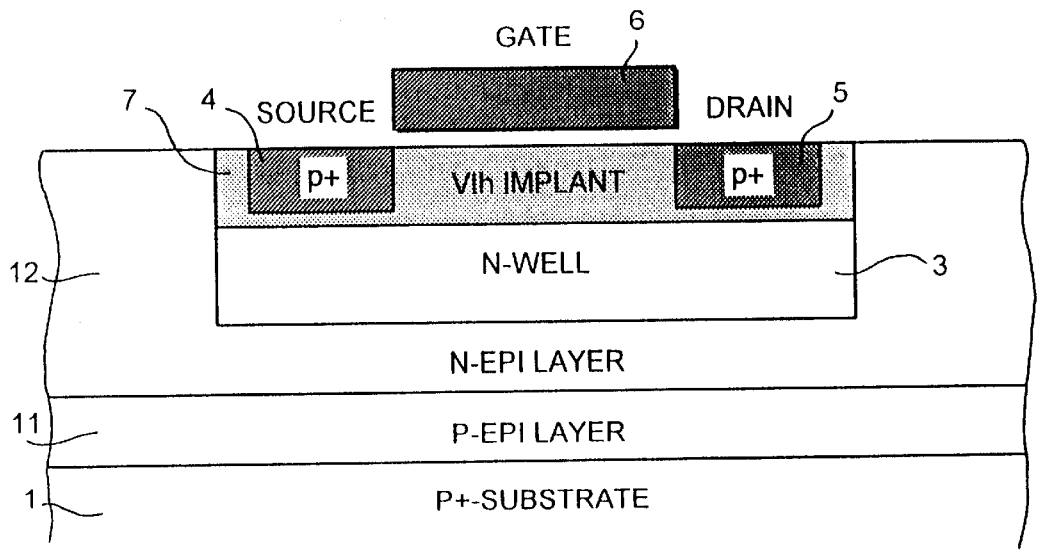
FIGS. 5 and 6 respectively show variants of the PMOS and NMOS enhancement transistors of FIGS. 3 and 4.
Figure 6:
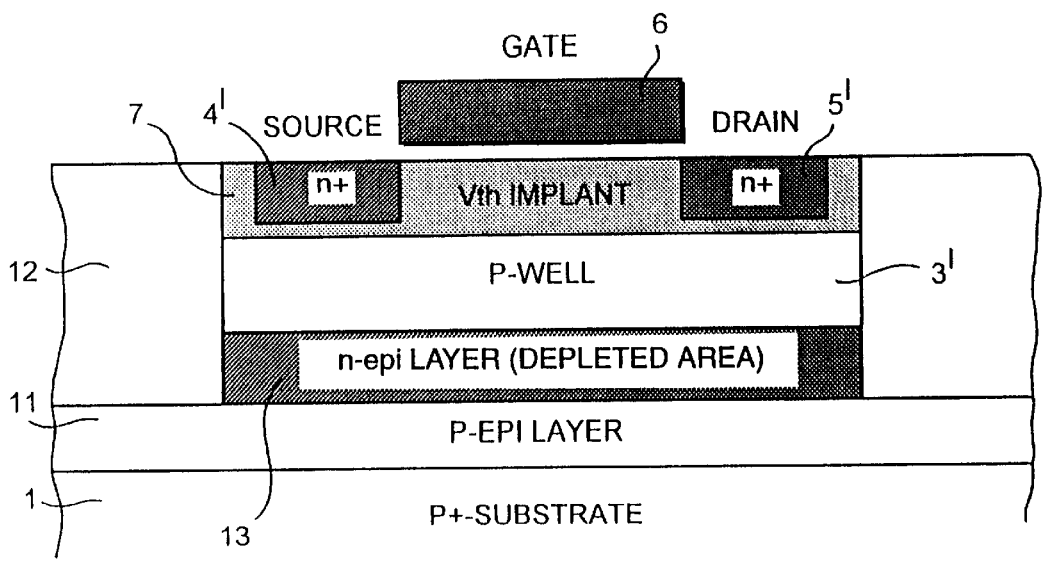

A similar effect can be achieved by depositing an additional epitaxial layer onto a conventional p+ substrate/p-type epitaxial layer wafer or even a homogeneous p-type substrate layer. Such a construction is illustrated in FIGS. 5 and 6, in which an n-type epitaxial layer 13 is deposited onto a p-type epitaxial layer carried by the p+ substrate.

It will be appreciated that a similar effect can be achieved by the use of a p-type epitaxial layer on an n-type substrate. In that case the best improvement will be achieved for devices that are formed in n-type wells.

In comparison to the previously mentioned ways to improve noise isolation, embodiments of the invention can be manufactured using a standard CMOS process, and do not require any additional stages in processing, such as production of deep wells. The only change required is to use a different starting wafer. In addition, embodiments of the invention using a p+ substance can offer a good ground plane due to a low resistivity substrate under the epi layer, while in comparison the bipolar or BiCMOS processes have a substrate with a resistivity several orders of magnitude higher, leading to poor AC ground.

What is claimed is:

1. A semiconductor integrated circuit comprising a substrate of a first conduction type semiconductor material, an epitaxial layer which is carried by the substrate and which is of a second conduction type semiconductor material different than the first conduction type material, a well of semiconductor material in the epitaxial layer and a semiconductor device formed in and/or on said well of semiconductor material, wherein the epitaxial layer is fully depleted of charges in a region substantially beneath the well when the circuit is subjected to a bias voltage, so that the epitaxial layer is an isolation layer and is depleted at all times.

2. A circuit as claimed in claim 1, comprising a plurality of such wells of material formed in the epitaxial layer, each well including a semiconductor device.

3. A circuit as claimed in claim 2, wherein at least one such device defines an analogue circuit area, and at least one other such device defines a digital circuit area, the analogue and digital circuit areas being defined by different respective wells of material the epitaxial layer.

4. A circuit as claimed in claim 2, wherein the first conduction type semiconductor material is p-type material, and the second conduction type semiconductor material is n-type material.

5. A circuit as claimed in claim 4, wherein at least one of the devices is a CMOS transistor formed in a well of p-type semiconductor material.

6. A circuit as claimed in claim 4, wherein at least one of the devices is a CMOS transistor formed in a well of n-type semiconductor material.

7. The circuit of claim 1, wherein said region depleted of charge is located entirely beneath said well.

8. A method of manufacturing a semiconductor integrated circuit comprising:
   providing a substrate of first conduction type semiconductor material;
   forming an epitaxial layer of semiconductor material on the substrate;
   forming a well of semiconductor material in the epitaxial layer; and
   forming a semiconductor device structure in and/or on the well of the semiconductor material,
   wherein the epitaxial layer is of a second conduction type semiconductor material, the second conduction type being different than the first conduction type, and wherein the epitaxial layer is formed so as to be fully depleted of charges in a region substantially beneath the well when the circuit is subjected to a bias voltage so that the epitaxial layer is an isolation layer and is depleted at all times.

9. A method as claimed in claim 8, wherein the first conduction type material is p-type material and the second conduction type material is n-type material.

10. The method of claim 8, wherein the epitaxial layer is an isolation layer and is not part of the semiconductor device or any other active device.

11. A semiconductor integrated circuit comprising a substrate of a first conduction type semiconductor material, an epitaxial layer which is carried by the substrate and which is of a second conduction type semiconductor material different than the first conduction type material, a well of semiconductor material in the epitaxial layer and a semiconductor device formed in and/or on said well of semiconductor material, wherein the epitaxial layer is substantially depleted of charges in a region substantially beneath the well when the circuit is subjected to a bias voltage, and wherein said epitaxial layer is an isolation layer and is not part of an active device.

* * * * *